(12) United States Patent
Yang et al.

(10) Patent No.: US 8,471,997 B2
(45) Date of Patent: Jun. 25, 2013

(54) LCD APPARATUS WITH HEAT DISSIPATION ARRANGEMENTS

(75) Inventors: Yanming Yang, Shenzhen (CN); Nanfang Xie, Shenzhen (CN); Cai Kang, Shenzhen (CN)

(73) Assignee: Shenzhen New Super-Bright LCD Display Co., Ltd., Guangdong (CN)

( * ) Notice: Subject to any disclaimer, the term of this patent is extended or adjusted under 35 U.S.C. 154(b) by 244 days.

(21) Appl. No.: 12/988,120

(22) PCT Filed: May 26, 2009

(86) PCT No.: PCT/CN2009/071975
§ 371 (c)(1),
(2), (4) Date: Oct. 15, 2010

(87) PCT Pub. No.: WO2009/143764
PCT Pub. Date: Dec. 3, 2009

(65) Prior Publication Data
US 2011/0037937 A1    Feb. 17, 2011

(30) Foreign Application Priority Data
May 27, 2008 (CN) .......................... 2008 1 0067400

(51) Int. Cl.
    *G02F 1/1333* (2006.01)
    *H05K 7/20* (2006.01)
    *G09F 13/04* (2006.01)

(52) U.S. Cl.
    USPC .............. 349/161; 349/56; 349/61; 361/697; 362/97.1; 362/97.2

(58) Field of Classification Search
    USPC ............ 349/161, 56, 72, 20, 19, 58, 61, 122, 349/138; 362/97.1, 97.2, 97.3, 97.4; 361/697, 361/695; 315/50
    See application file for complete search history.

(56) References Cited

U.S. PATENT DOCUMENTS

| | | | | |
|---|---|---|---|---|
| 5,748,269 A * | 5/1998 | Harris et al. | | 349/58 |
| 5,803,566 A * | 9/1998 | Ogino | | 353/60 |
| 6,043,979 A * | 3/2000 | Shim | | 361/695 |
| 7,607,790 B2 * | 10/2009 | Chen et al. | | 362/97.1 |
| 7,663,730 B2 * | 2/2010 | Shibata | | 349/161 |

(Continued)

FOREIGN PATENT DOCUMENTS

| | | |
|---|---|---|
| CN | 1469164 A | 1/2004 |
| CN | 2687706 Y | 3/2005 |

(Continued)

OTHER PUBLICATIONS

International Search Report (PCT/ISA/210) issued on Sep. 3, 2009, by Chinese Patent Office as the International Searching Authority for International Application No. PCT/CN2009/071975.

*Primary Examiner* — Brian Healy
(74) *Attorney, Agent, or Firm* — Buchanan Ingersoll & Rooney PC

(57) ABSTRACT

An LCD apparatus comprising an LCD screen, backlight arrangements for providing back illumination to the LCD screen, video processing circuitry and air moving devices, characterized in that the air moving devices are arranged to move air to condition the image displaying surface of the LCD screen. An LCD image displaying apparatus according to the present invention could operate at a brightness level of above 1000 nits, and even 3000 nits, which provides an astounding visual effect in the outdoor environment.

18 Claims, 7 Drawing Sheets

U.S. PATENT DOCUMENTS

| | | |
|---|---|---|
| 2003/0231271 A1 | 12/2003 | Saitoh |
| 2005/0073639 A1* | 4/2005 | Pan .................................. 349/161 |
| 2006/0125998 A1* | 6/2006 | Dewa et al. ..................... 349/161 |
| 2006/0132699 A1* | 6/2006 | Cho et al. ........................ 349/161 |
| 2008/0080167 A1* | 4/2008 | Chang .............................. 362/97 |
| 2009/0147170 A1* | 6/2009 | Oh et al. .......................... 349/58 |
| 2010/0238394 A1* | 9/2010 | Dunn ............................... 349/161 |
| 2011/0037937 A1* | 2/2011 | Yang et al. ...................... 349/161 |
| 2012/0188481 A1* | 7/2012 | Kang et al. ...................... 349/61 |

FOREIGN PATENT DOCUMENTS

| | | |
|---|---|---|
| CN | 101078835 A | 11/2007 |
| CN | 101101404 A | 1/2008 |
| CN | 201018745 Y | 2/2008 |
| CN | 201199303 Y | 2/2009 |
| JP | 2005-283852 A | 10/2005 |

* cited by examiner

A-A

B-B

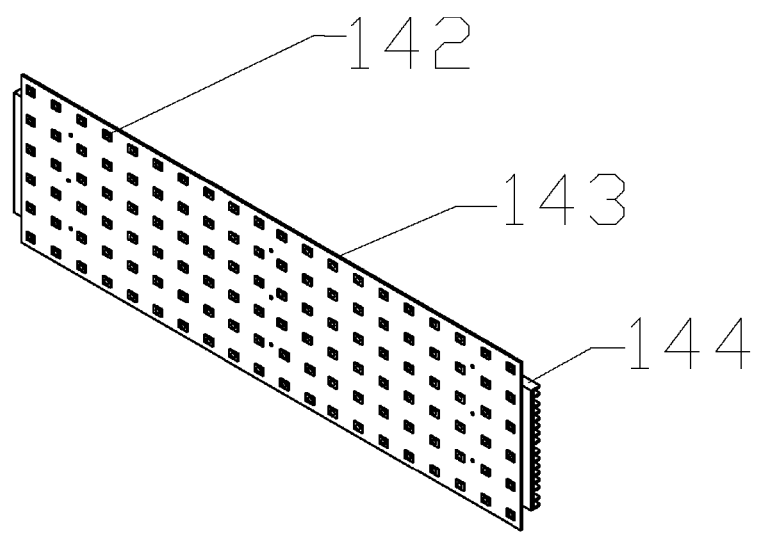
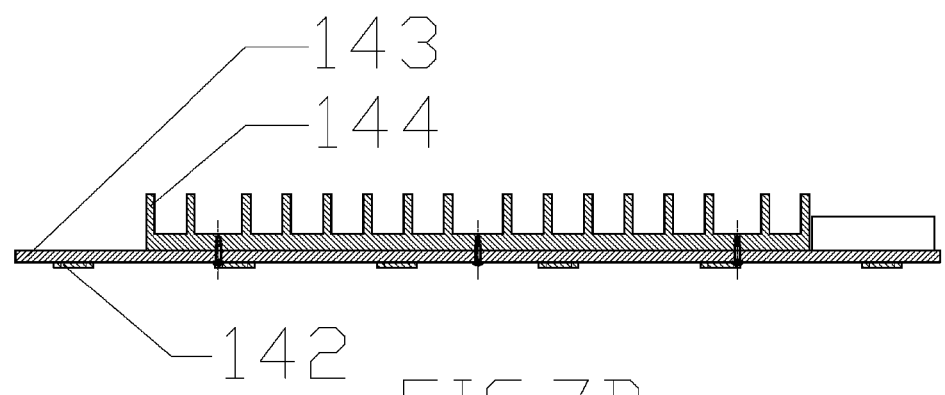

LCD APPARATUS WITH HEAT DISSIPATION ARRANGEMENTS

FIELD OF THE INVENTION

The present invention relates to LCD apparatus, and more particularly to backlit LCD apparatus for outdoor displaying of images.

BACKGROUND OF THE INVENTION

LCD panels are widely used in flat panel displays and are gaining increasing popularity over cathode ray tube (CRT) or LED panels because of their various advantages such as light weight, high resolution, and low power consumption. Known LCD panels are typically of the reflective or transmissive types. The reflective type LCD uses reflection to illuminate the LCD panel and its operation is dependent on the availability of external light sources. The transmissive type LCD uses an internal light source for illumination and the internal light source is commonly referred to as backlight. An advantage of the transmissive type LCD, which is also commonly referred to as backlit LCD, is its usefulness for outdoor operation because its backlight intensity can be adjusted according to the ambient light conditions of the outdoor environment which changes widely during different times of the day and according to weather conditions.

Although a backlit LCD display is an appropriate candidate for outdoor use, the harsh outdoor operating conditions could be adverse to the operation of an LCD display. For example, when an LCD panel is exposed directly under sunlight, the surface temperature of the LCD cells can rise to above 80° C., and prolonged exposure to such high temperatures could result in premature darkening of an LCD screen, resulting in premature failure of the LCD panel. Another challenge which needs to be tacked to enable backlit LCD to be commercially meaningful as an outdoor image display is the need to provide sufficient backlight to provide adequate contrast for the viewing public. However, additional backlight would lead to additional heating of the apparatus which is not compatible with preferred operating conditions of LSD. On the other hand, when the outdoor conditions become extremely cold, an LCD display would not function properly.

Therefore, it would be advantageous if there could be provided improved LCD apparatus which alleviate shortcomings of conventional LCD apparatus.

SUMMARY OF THE INVENTION

According to the present invention, there is provided an LCD apparatus comprising an LCD screen, backlight arrangements for providing back illumination to the LCD screen, video processing circuitry and air moving devices, characterized in that the air moving devices are arranged to move air to condition the image displaying surface of the LCD screen. The air moving devices may be arranged to form an air curtain to promote more even conditioning to the LCD screen.

In an embodiment, the apparatus comprises a transparent screen which is spaced apart from the image displaying surface of the LCD screen, characterized in that, the air moving devices are arranged to move air in the space between the transparent screen and the LCD screen to condition the LCD screen.

An LCD apparatus comprising ventilation means to condition the surface temperature of an LCD display surface would substantially mitigate problems of LCD display overheating associated with harsh outdoor applications. An LCD image displaying apparatus according to the present invention could operate at brightness level of above 1000 nits, and even 3000 nits, which provides an astounding visual effect in the outdoor environment.

In another aspect of the present invention, there is provided a backlight module for an LCD apparatus comprising a matrix of LEDs mounted on one side of a double sided metal coated board, and heat sinks mounted on another side of the double sided metal coated board, characterized in that metalised through holes connecting the two metal coated sides of the coated board are provided to transfer heat from the LEDs to the heat sink for dissipating heat generated by the backlight arrangements. This backlight module provides efficient heat dissipation to facilitate very bright LCD panels suitable for outdoor applications.

The heat sink of the backlight module may comprise a plurality of substantially parallel and elongate heat dissipating fins which collectively form air moving channels to guide movement of air for dissipating heat from the heatsinks. Such channels have the advantage of promoting smooth flow of ventilation within an LCD apparatus.

This and other features of the invention will be explained below in further details below.

BRIEF DESCRIPTION OF THE DRAWINGS

Exemplary embodiments of the present invention will be illustrated by way of example with reference to the accompany drawings, in which, FIG. 7A is a perspective view of a backlight module of the apparatus of FIG. 1, and FIG. 7B is a cross-sectional view of FIG. 7A.

DETAILED DESCRIPTION OF EXEMPLARY EMBODIMENTS

Figure 1:
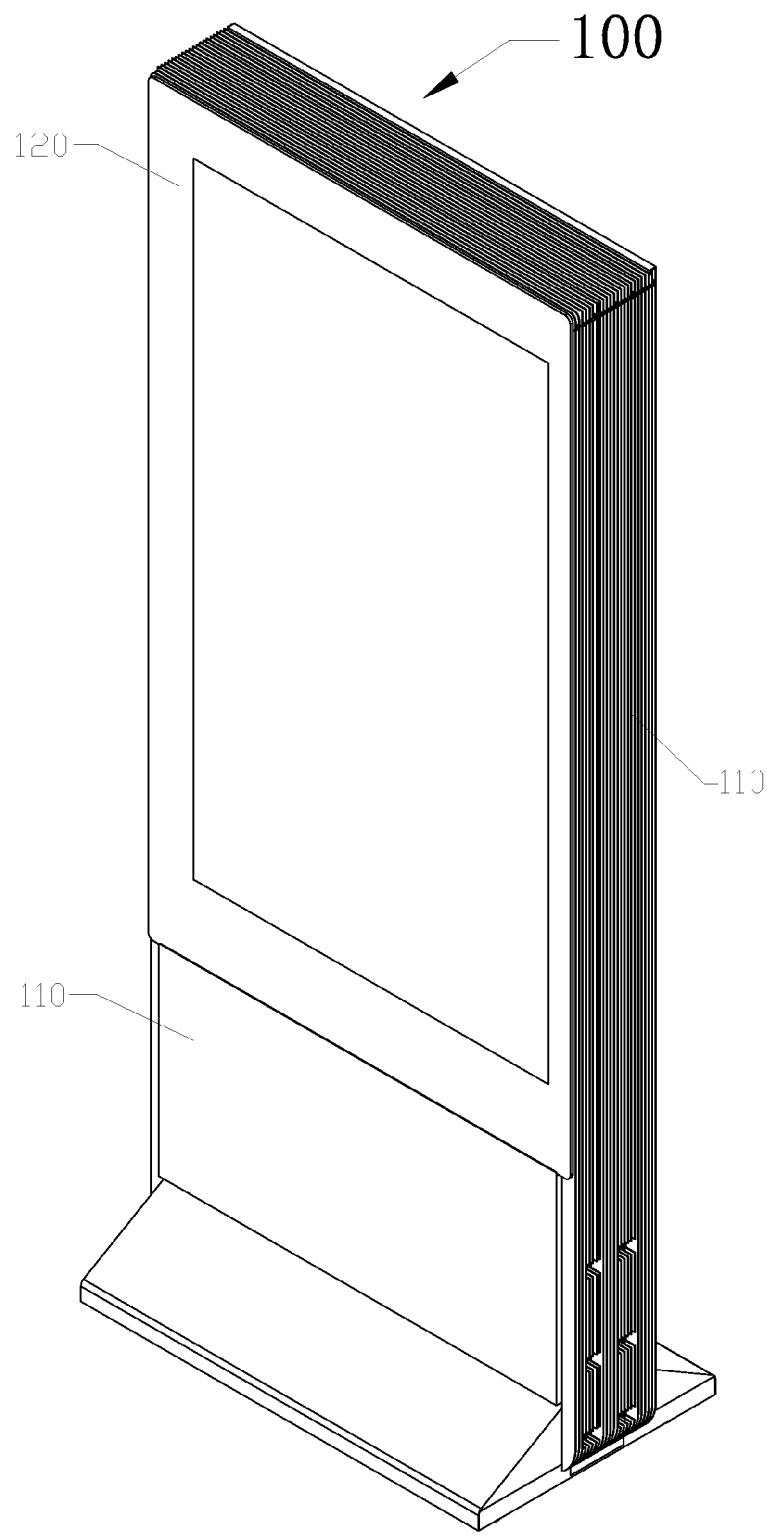
FIG. 1 is a front perspective view of an embodiment of an outdoor LCD apparatus of the present invention.
Figure 2:
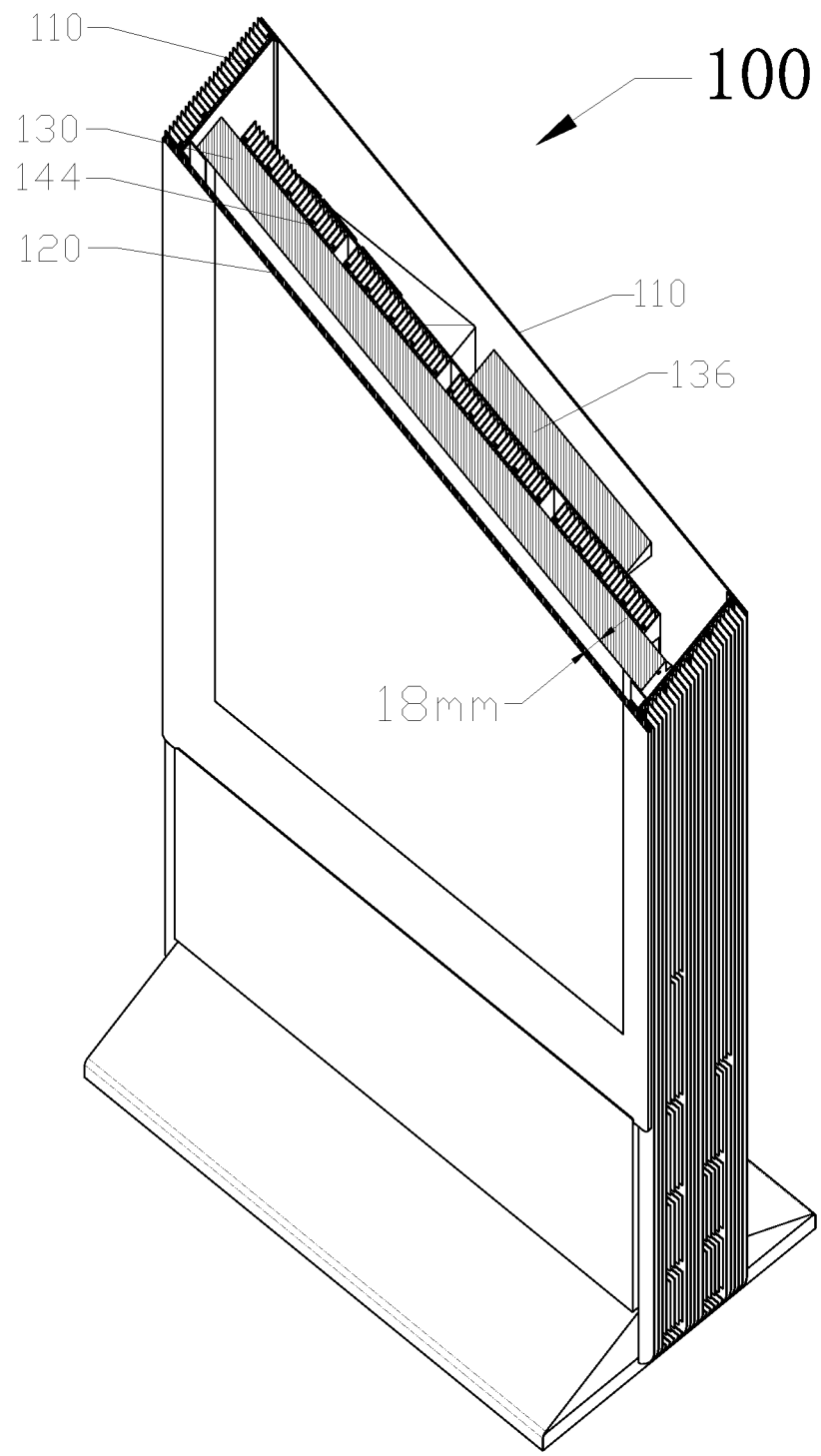
FIG. 2 is a partially truncated view exposing the interior of FIG. 1.
Figure 3:
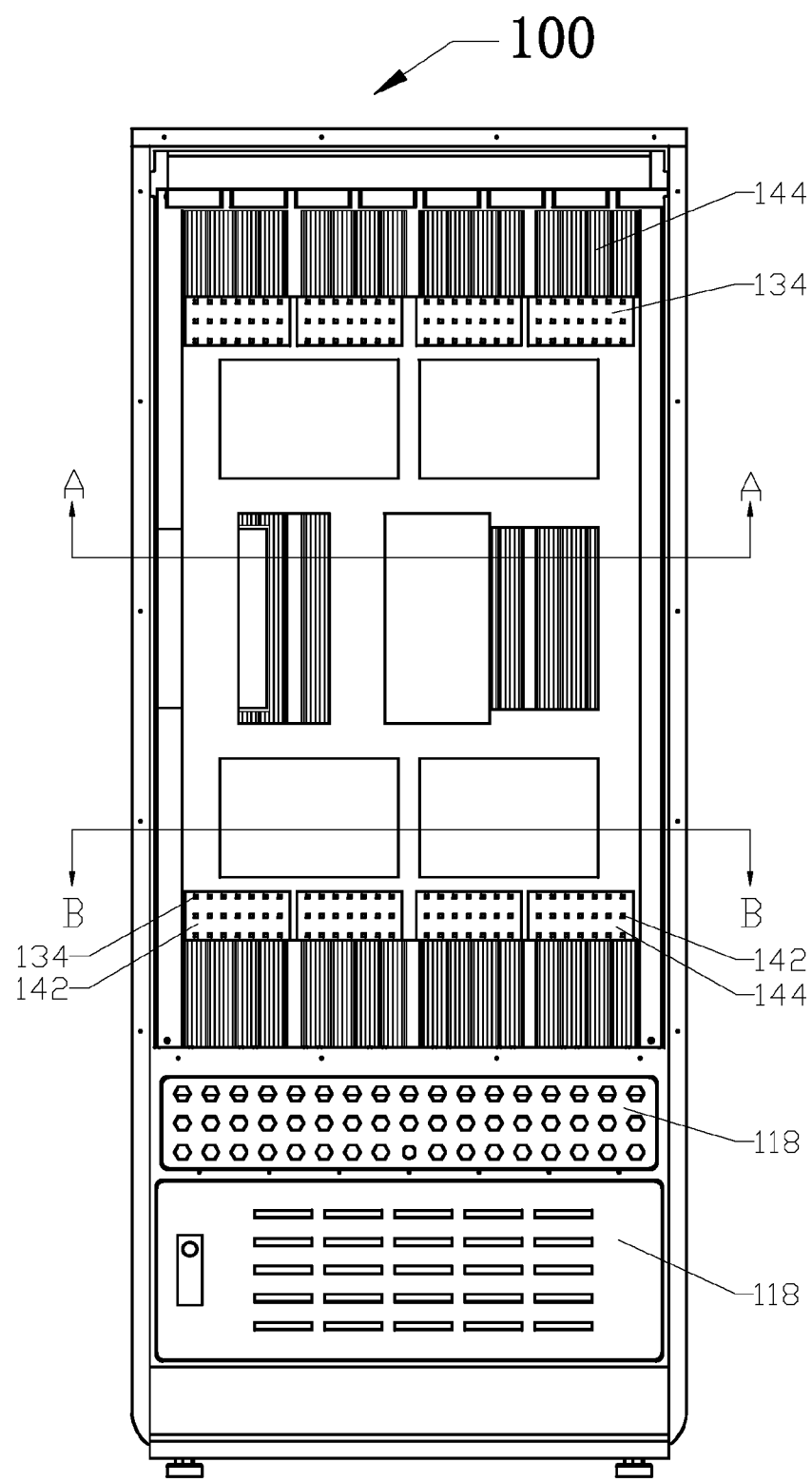
FIG. 3 is an exposed rear view of the apparatus of FIG. 1.
Figure 4:
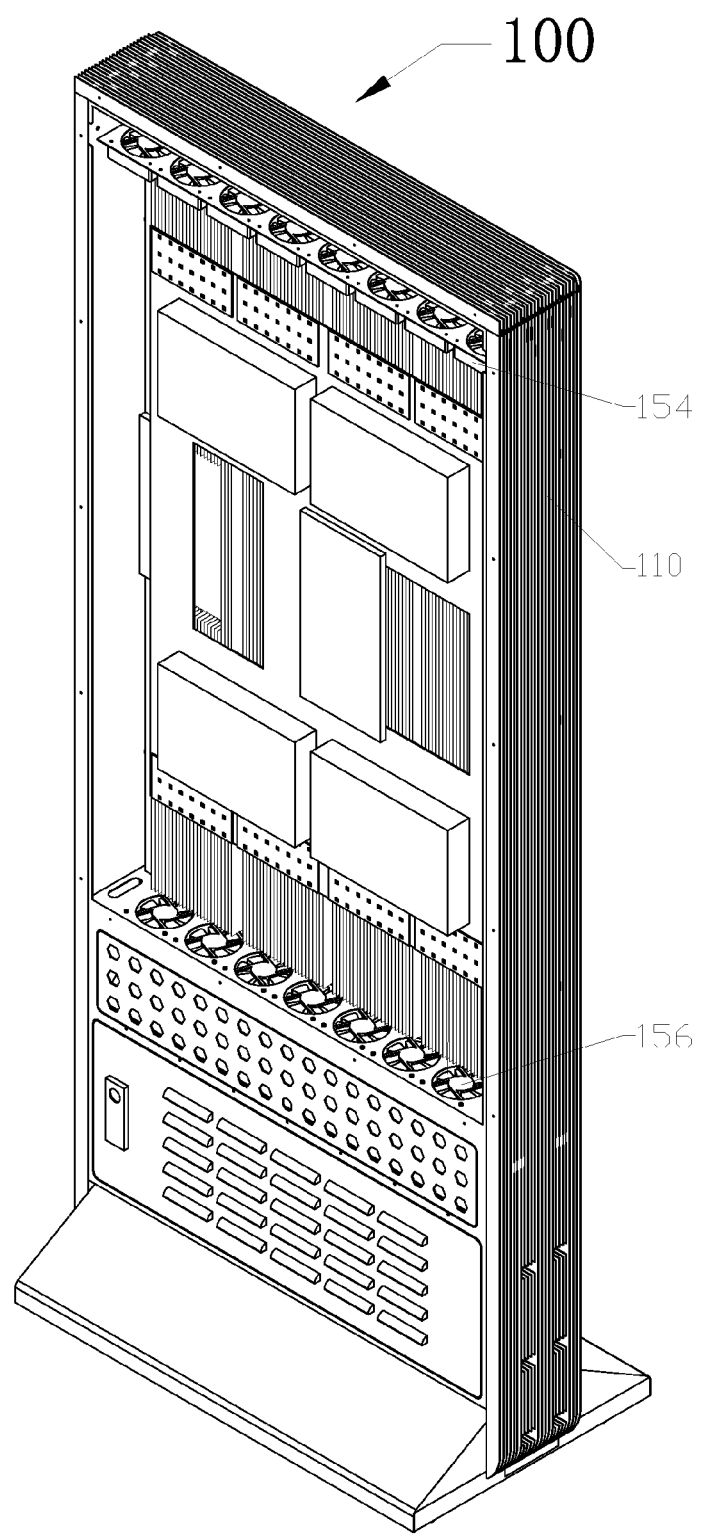
FIG. 4 is an exposed rear perspective view of FIG. 3, FIGS. 5A & 5B are longitudinal cross-sectional views of the apparatus of FIG. 1 taken along the center and depicting first and second operation modes respectively.

Referring to FIGS. 1 to 6B, an LCD apparatus 100 for displaying moving images illustrating a first embodiment of the present invention comprises a housing 110 on which a front transparent screen 120, an LCD panel 130 comprising a liquid crystal display cell 132, backlight modules 134, video and electronic circuitry 136, and air moving devices are mounted. The LCD panel is mounted with its image-displaying surface facing and spaced apart from the front transparent screen for viewing from the front side. The LCD panel, the backlight modules and the circuitry are formed as an LCD panel subassembly, which is mounted on the housing of the apparatus. The housing is primarily a metal casing which is supported on a stand and includes a rear cover (not shown) to shield the various components. The transparent screen provides physical protection to the LCD panel against harsh weather conditions such as rainstorm, wind and dust storm, while permitting unobstructed viewing of images showing on the front viewing surface of the LCD panel. However, the transparent screen also acts as a glass or green house, which elevates the internal temperature in the space between the transparent screen and the image displaying surface of the LCD panel.

A plurality of backlight modules more particularly shown in FIGS. 7A to 7D is mounted on the back of the LCD panel to provide back illumination to the LCD screen. The backlight modules are arranged such that the entire image displaying surface of the LCD screen is back-illuminated to enable image viewing from the front side under different ambient lighting conditions. In general, the backlight arrangements have to generate very strong illumination to provide a brightness of above 1000 nits when the display apparatus are operating under strong sunlight to display images of good viewing, although the requirements on the intensity of backlight illumination lessen when operating in the absence of sunlight. Such a high brightness requirement, coupled with the high temperature resulting from exposure of the apparatus under direct sunlight, creates an imminent heat dissipation problem which has to be alleviated if an LCD apparatus is of practical utility for outdoor applications.

Each backlight module comprises a matrix of LEDs 142 which are mounted on one side of a double sided printed circuit board and controlled by backlight control circuitry which provides dynamic backlight control. The printed circuit board comprises an insulated board which is coated with a layer of metal, such as copper, on both sides. The side of the double sided printed circuit board mounted with the LEDs includes a printed circuit on which associated circuitry such as the LED drivers and power supply circuitry are mounted. A plurality of metalized through holes are formed on the printed circuit board and are distributed to provide thermal connection to transport heat generated by the LEDs to the metal coated surface on the other side (the back side) of the printed circuit board. To further enhance heat dissipation efficiency, heat sinks are mounted on the back side of the printed circuit board and the thermal contact between the heatsink and the backside of the metal coated printed circuit board is enhanced by applying thermal conductive glues to the contact surfaces between the heatsink and the metal coated backside of the printed circuit board. To enhance heat dissipation efficiency, the heatsink is a singly molded metal piece made, for example, of aluminum or aluminum alloy. The backside of the heatsink, which is distal from the LCD panel, comprises a plurality of elongate and parallel heat dissipating fins, which collectively define channels with the fins forming the walls of the channel. To further enhance heat dissipation, the channels of the heatsinks are aligned to the direction of forced air flow as explained below.

Figure 5A:
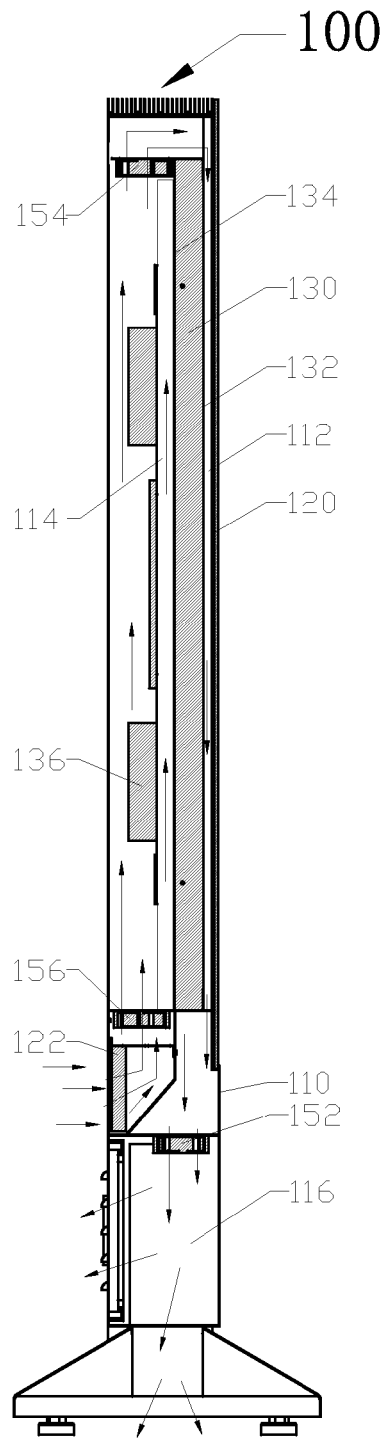

To meet the stringent outdoor operation requirement, especially the high brightness requirements when operating under bright sunlight, forced ventilation arrangements are provided in the apparatus. Referring to FIGS. 1 to 4, the arrangement of the LCD panel subassembly and the housing 110 defines a front compartment 112 and a rear compartment 114. The front compartment 112 is defined by the space between the LCD screen and the transparent screen, and the rear compartment 114 is defined between the subassembly and the backside of the housing. To provide cooling air to the LCD panel, a first set of air moving devices 152, such as rotary fans, is distributed across the width of the housing at the bottom of the housing in an in-line fashion. The first set of fans is disposed intermediate the front compartment and an empty compartment 116 located underneath the LCD panel subassembly. In a first mode of operation as depicted in FIG. 5A, the first set of fans is arranged to operate to draw cooling air from outside the housing into the empty compartment via an air inlet located at the bottom of the housing and then to blow at the front compartment. In this mode of operation, cooling air is applied directly to the front viewing surface of the LCD screen to effect cooling by forced ventilation. To promote smooth airflow, a second set of air moving devices 154 is disposed at the top of the apparatus. More specifically, the second set of fans comprising a plurality of motorized fans is distributed transversely in an in-line arrangement across the width of the LCD subassembly. The second set of fans is disposed in the space between the housing and the top of the LCD subassembly which is in communication with the front compartment. To cooperate with the first set of fans, the second set of fans is arranged to operate to draw air from the front compartment and move the air leaving the front compartment to the back compartment. The air moved by the second set of fans is then used to cool the heatsinks of the backlight modules. To promote smooth, or non-vortex air flows in the rear compartment, a third set of air moving devices 156 is disposed at the downstream end of the rear compartment of the apparatus. The third set of fans is arranged to move air coming from the second set of fans towards the air outlet located at the bottom of the rear compartment. To promote efficient air passage in the rear compartment, the heatsinks are arranged such that the channels formed by the heat dissipating fins extend in the direction of airflow defined by the second and third set of fans. This direction is substantially parallel to the axes of rotation of the fans or the longitudinal direction of the apparatus. The transversely distributed air moving devices is collectively arranged to generate a curtain of air which is moved through the LCD screen to produce conditioning thereto.

Figure 5B:
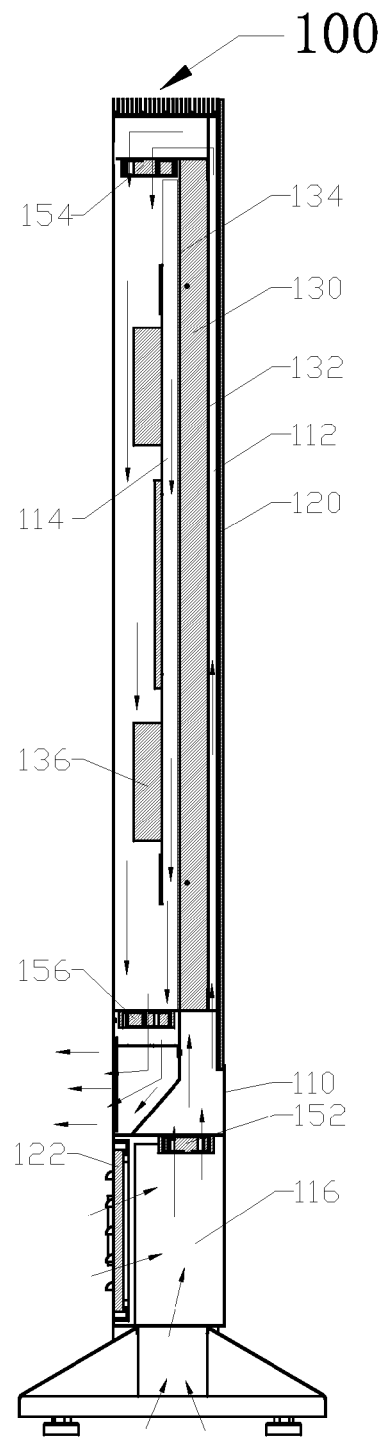
Figure 6A:
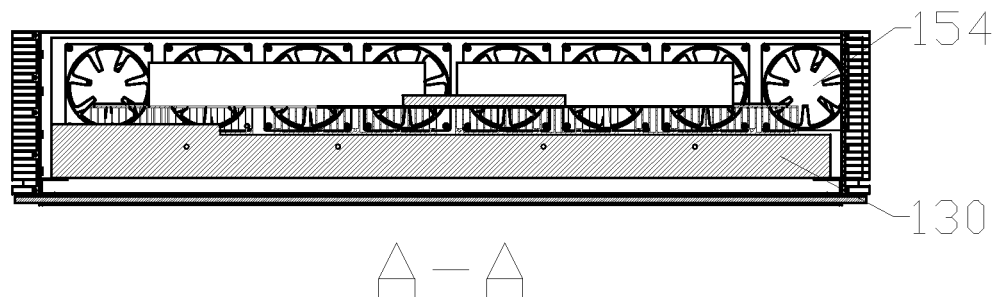
FIGS. 6A & 6B are cross-sectional views of FIG. 1 taken along the lines A-A and B-B respectively.
Figure 6B:
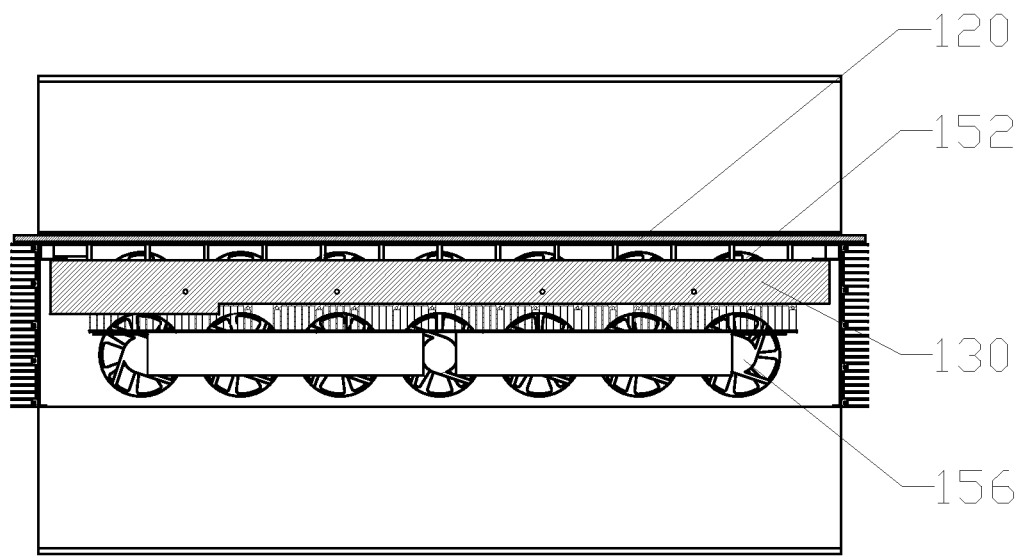

In a second mode of operation as depicted in FIG. 5B, which is preferred for operating in severely cold environments, the direction of operation of the three sets of fans is reversed. In this mode of operation, air is moved firstly into the rear compartment by the third set of fans and encounters heatsinks of the backlight modules. The air, after passing through the heatsinks and warmed, is then moved into the front compartment by the second set of fans to warm the LCD screen such that the LCD panel could operate under its rated temperature conditions. The first set of fans then operate to move the air out of the front compartment.

To provide weather and dust shielding to the internal components of the apparatus, sheltered air inlets are located at the bottom of the housing and are provided with air filters 122 which are mounted on grilled covers 118. The sheltering and filters mitigate the problems of dust contamination and weathering of the internal components to promote longer service life in harsh outdoor environments. In this regard, it would be understood that the nomenclature of the terms "air-inlet" and "air-outlet" are dependent on the mode of operation and shall be accordingly named.

While the present invention has been explained with reference to the embodiments described herein, it would be appreciated by persons skilled in the art that the embodiments are non-limiting example only, and the invention is independent of any particular types of fans, backlight modules or heatsinks without loss of generality. For example, while air moving devices in the above embodiments are arranged to cause airflow to move between the front and rear compartments, it would be appreciated that air could be caused to flow to condition the LCD screen only. In addition, or alternatively, the airflow could be from one transverse side of the front compartment to another transverse side and then exits from that another side via side apertures on the housing, or move from the bottom portion of the LCD screen to the top portion thereof and exit at apertures located at the top portion of the housing without loss of generality.

LIST OF NUMERALS

| 100 | LCD apparatus |
| 110 | housing |
| 112 | Front compartment |
| 114 | Rear compartment |
| 116 | Empty compartment |
| 118 | Grilled covers |
| 120 | Transparent screen |
| 122 | Air-filter |
| 130 | LCD panel |
| 132 | LCD cell |
| 134 | Backlight module |
| 136 | Peripheral circuitry |
| 142 | LED |
| 144 | heatsink |
| 146 | fins |
| 152 | First fan set |
| 154 | Second fan set |
| 156 | Third fan set |

The invention claimed is:

1. An LCD apparatus, comprising:
an LCD screen;
backlight arrangements for providing back illumination to the LCD screen;
video processing circuitry; and
air moving devices, wherein the backlight arrangement includes a matrix of LEDs mounted on one side of a double sided metal coated board, and a heatsink mounted on an other side of the double sided metal coated board, and the air moving devices are arranged to move air to condition an image-displaying surface of the LCD screen, and wherein the air moving devices are operable to change a first direction of movement of air moving from the LCD screen to the heatsink to a second direction of movement of air from the heatsink to the LCD screen.

2. The LCD apparatus according to claim 1, comprising:
a transparent screen which is spaced apart from the image displaying surface of the LCD screen, wherein the air moving devices are arranged to move air in a space between the transparent screen and the LCD screen to condition the LCD screen.

3. The LCD apparatus according to claim 2, wherein metalised through holes connecting the two metal coated sides of the coated board are provided to transfer heat from the LEDs to the heat sink.

4. The LCD apparatus according to claim 3, wherein the heat sink is attached to a back of the backlight unit and includes a plurality of substantially parallel and elongate heat dissipating fins, wherein the elongate heat dissipating fins extend substantially parallel to a flow direction of air flow and collectively define air flow channels to guide the movement of air due to the air moving devices.

5. The LCD apparatus according to claim 4, wherein the air moving devices are arranged to move external cooling air into the LCD apparatus via an entry at a bottom of the LCD screen and then to move the cooling air to a space between the LCD screen and the transparent screen for cooling the LCD screen.

6. The LCD apparatus according to claim 5, wherein the air moving devices are arranged to move air leaving the space between the LCD screen and the transparent screen into the back of the backlight units for cooling the heatsinks.

7. The LCD apparatus according to claim 4, wherein the air moving devices are arranged to move external cooling air into the apparatus via a bottom of the apparatus, to move the cooling air across the heat sink to cool the backlight unit, and then to move warmed air exiting from the heatsink to the space between the LCD screen and the transparent screen to warm the LCD screen.

8. The LCD apparatus according to claim 3, wherein the air moving devices are arranged to move external cooling air into the apparatus via a bottom of the apparatus, to move the cooling air across the heat sink to cool the backlight unit, and then to move warmed air exiting from the heatsink to a space between the LCD screen and the transparent screen to warm the LCD screen.

9. The LCD apparatus according to claim 2, wherein the air moving devices are arranged to move external cooling air into the apparatus via a bottom of the apparatus, to move the cooling air across the heat sink to cool the backlight unit, and then to move warmed air exiting from the heatsink to a space between the LCD screen and the transparent screen to warm the LCD screen.

10. The LCD apparatus according to claim 1, wherein the air moving devices are arranged to move external cooling air into the apparatus via a bottom of the apparatus, to move the cooling air across the heat sink to cool the backlight unit, and then to move warmed air exiting from the heatsink to a space between the LCD screen and the transparent screen to warm the LCD screen.

11. The LCD apparatus according to claim 1, comprising:
a housing wherein the LCD screen, the backlight arrangements, and the transparent screen are mounted in the housing, the housing and the heatsinks collectively defining a compartment, the compartment communicable with a space between the LCD screen and the transparent screen via a passageway located between a top of the LCD screen and the housing; and
a plurality of air moving devices distributed at the passageway to move air between the compartment and the space between the LCD screen and the transparent screen.

12. The LCD apparatus according to claim 2, comprising:
a housing, wherein the LCD screen, the backlight arrangements, and the transparent screen are mounted in the housing, the housing and the heatsinks collectively defining a compartment, the compartment communicable with a space between the LCD screen and the transparent screen via a passageway located between a top of the LCD screen and the housing; and
a plurality of air moving devices distributed at the passageway to move air between the compartment and the space between the LCD screen and the transparent screen.

13. The LCD apparatus according to claim 1, comprising:
a filtered entry, wherein the air moving devices are arranged such that air enters at a bottom of the apparatus via the filtered entry and moves upwardly towards the heatsinks to dissipate heat from the heatsinks.

14. The LCD apparatus according to claim 2, comprising:
a filtered entry, wherein the air moving devices are arranged such that air enters at a bottom of the LCD display via the filtered entry and moves upwardly towards the heatsinks to dissipate heat from the heatsinks.

15. A backlight module for an LCD apparatus comprising:
a matrix of LEDs mounted on one side of a double sided metal coated board;
heat sinks mounted on another side of the double sided metal coated board; and metalised through holes connecting the two metal coated sides of the coated board provided to transfer heat from the LEDs to the heat sink for dissipating heat generated by the backlight arrangements.

16. The backlight module according to claim 15, wherein the heat sink comprises a plurality of substantially parallel and elongate heat dissipating fins which collectively form air moving channels to guide movement of air for dissipating heat from the heatsinks.

17. The backlight module according to claim 15, wherein the one side of the double sided metal-coated board on which the LEDs are mounted is a printed circuit board.

18. The backlight module according to claim 16, wherein the one side of the double sided metal-coated board on which the LEDs are mounted is a printed circuit board.

* * * * *